United States Patent [19]

Hsu et al.

[11] Patent Number: 5,793,313
[45] Date of Patent: Aug. 11, 1998

[54] APPARATUS AND METHOD FOR SCANNING A KEY MATRIX

[75] Inventors: Jerry Hsu, Tainan; Wesley Jehng, Hsinchu, both of Taiwan

[73] Assignee: United Microelectronics Corporation, Taiwan

[21] Appl. No.: 892,022

[22] Filed: Jul. 14, 1997

Related U.S. Application Data

[62] Division of Ser. No. 686,945, Jul. 26, 1996.

[51] Int. Cl.$^6$ .................................................... H03K 17/94
[52] U.S. Cl. .................................... 341/26; 340/825.79
[58] Field of Search ........................... 341/26, 20; 345/169; 340/825.79; 379/368; 364/189

[56] References Cited

U.S. PATENT DOCUMENTS

| | | | |
|---|---|---|---|
| 4,570,154 | 2/1986 | Kinghorn | 341/26 |
| 4,583,092 | 4/1986 | Saito | 340/825.79 |
| 4,667,181 | 5/1987 | Hastreiter | 341/26 |
| 4,902,878 | 2/1990 | Smith | 219/486 |
| 4,906,993 | 3/1990 | Freeman | 341/26 |
| 5,555,985 | 9/1996 | Chang | 341/26 |
| 5,668,544 | 9/1997 | Chang | 341/26 |

Primary Examiner—Michael Horabik
Assistant Examiner—Albert K. Wong
Attorney, Agent, or Firm—Rabin & Champagne, P.C.

[57] ABSTRACT

An apparatus and method for scanning a triangular or trapezoidal key matrix for data input by depressing keys of a keypad. The key matrix allows an increased number of keyswitches to be provided on the key matrix while reducing the number of I/O ports on the I/O interface. The apparatus includes an I/O interface connecting the keypad to the CPU. The keypad I/O interface is provided with m I/O ports, where m is plural integer. Through detecting the voltage levels of these I/O ports, the CPU is able to determine which key on the keypad is being depressed. A triangular key matrix is constructed with a set of m code lines and at least one auxiliary code line arranged in such a way as to form a triangular array of m×(m+1)/2 cross-points. Each cross-point is provided with a keyswitch associated with a key on the keypad. The m code lines are connected correspondingly to the m I/O ports on the keypad I/O interface. In another embodiment, a trapezoidal key matrix is constructed with m code lines and two auxiliary code line including a ground line and a power line arranged in such a way as to form an m-by-(m+1) trapezoidal array of m×(m+3)/2 cross-points. The method according to the invention is performed by the apparatus to determine which key is being depressed and carry out various actions according to the function of the key being depressed.

5 Claims, 9 Drawing Sheets

APPARATUS AND METHOD FOR SCANNING A KEY MATRIX

This is a Division of application Ser. No. 08/686,945, filed Jul. 26, 1996.

BACKGROUND OF THE INVENTION

1. Field of the Invention

The invention relates to a keypad, and more particularly, to an apparatus and method for scanning a key matrix for data input by depressing the keys of a keypad provided on a data-processing unit. Characteristically, the invention provides a triangular or a trapezoidal matrix of keys that allows an increased number of keys on the keypad while reducing the number of input/output ports on an I/O interface for connecting to the key matrix.

Description of the Background Art

The use of a keypad to enter commands and/or data to data processing units is a well-known art. For instance, on telephone sets, an IC (integrated circuit) controller is used to scan the push-button keypad for any keys that are depressed by the user; or on handheld LCD game machines, the player can use a set of keys for control of the game, such as firing cannons or moving certain objects, by constantly pressing down related keys to generate commands to an IC controller for controlling the game. For such a keypad, the cost of manufacture is substantially proportional to the chip size of the IC controller.

As such, reducing the chip size of the aforementioned keypad IC controllers for telephone sets or game machines is presently the subject of a research effort in the semiconductor industry. Two approaches relating to improvements on the circuit layout have been proposed. The first approach is to utilize more advanced semiconductor fabrication technology to fabricate the IC chips with a feature size down to 0.5 μm (the current level is 0.8 μm), and even down to 0.35 μm, so as to reduce the chip area; and the second approach is to reduce the number of input/output (I/O) ports on the IC controller.

The second approach is a more substantial proposal in that if the IC controller has a great number of I/O ports, then even if the most advanced state-of-the-art semiconductor fabrication technology, with feature size less than 0.5 μm, is used, it is still very difficult to further downsize the IC chip to more miniaturized levels. This is because the bonding pads on the IC chip have a fixed size that cannot be further downsized, which is usually referred to as a "pad-limit" factor that restricts further downsizing of the IC chip (by contrast, the "core-limit" factor refers to a restriction imposed by the logic components in the IC chip). Moreover, the provision of a great number of I/O ports requires the use of more wires for the interconnection, thus significantly increasing the bonding cost.

Figure 1:
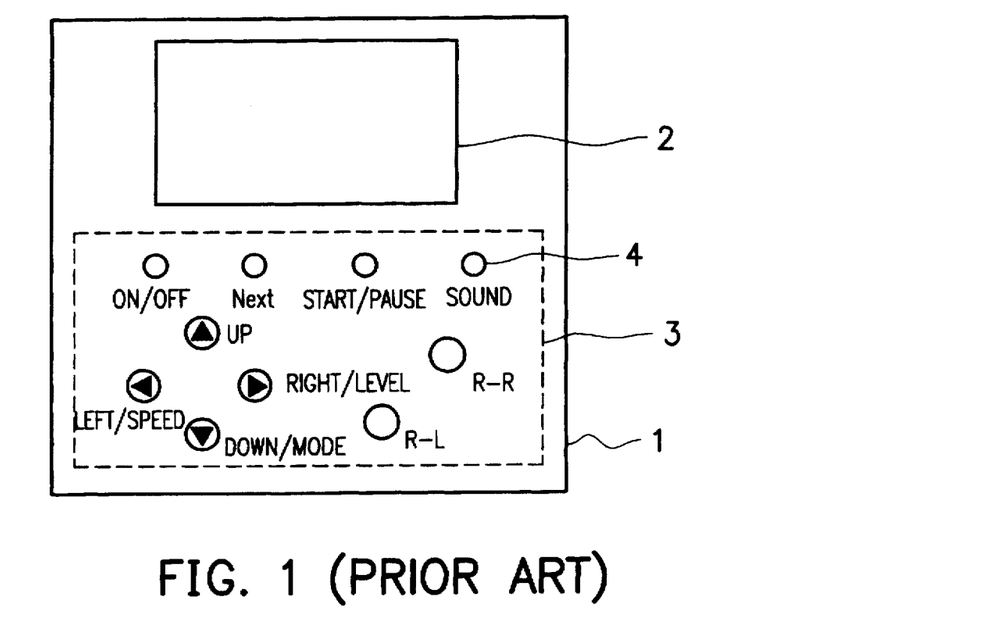
FIG. 1 is a top view of the front panel of a conventional handheld LCD game machine.

A prior art method for reducing the number of I/O ports on the aforementioned IC controllers for detecting keystrokes of the keypad of a game machine, is described in the following, with reference to FIGS. 1–4. Referring to FIG. 1, there is shown the front panel of a handheld LCD game machine I which includes an LCD 2 and a keypad 3 having a set of 10 keys 4 including four function keys: ON/OFF, Next, START/PAUSE, and SOUND; two rotation keys: R-R and R-L; and four shift keys: UP, DOWN/MODE, LEFT/SPEED, and RIGHT/LEVEL.

Figure 2:
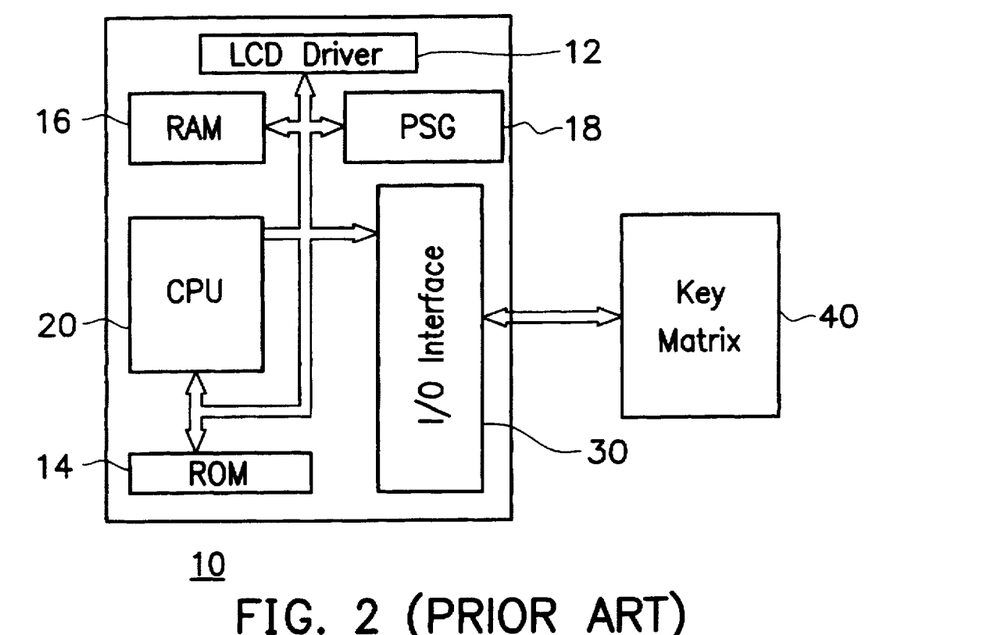
FIG. 2 is a block diagram of a keypad scan circuit incorporated in the game machine of FIG. 1.

Referring to FIG. 2, there is shown a block diagram of the circuit incorporated in the game machine of FIG. 1, which comprises a one-dimensional key matrix 40 and an IC controller 10.

Figure 3:
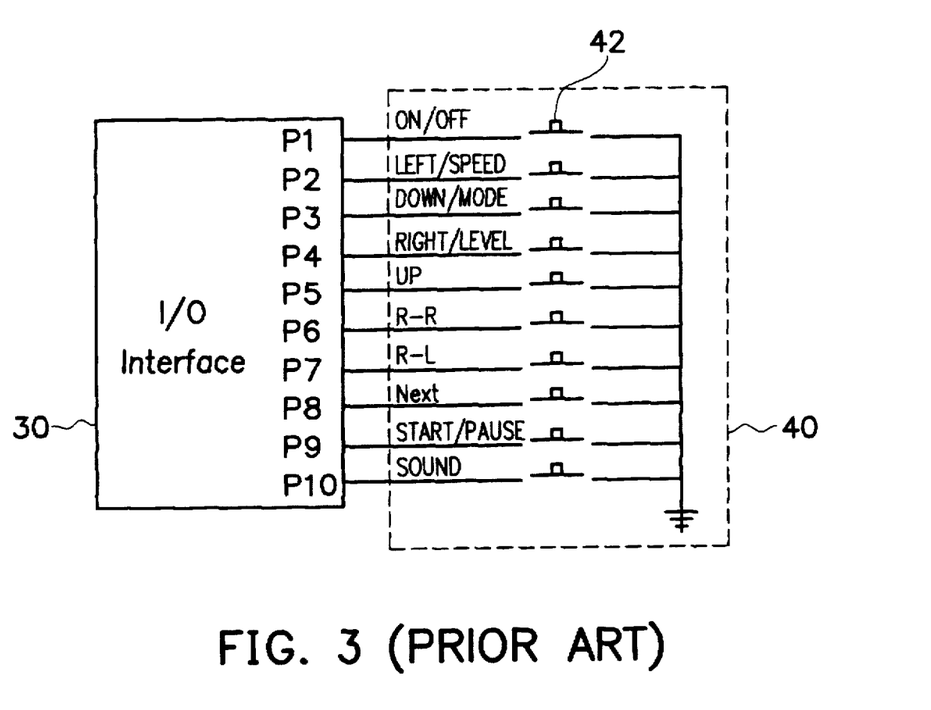
FIG. 3 is a schematic block diagram showing a conventional connection between a keypad and an I/O interface in the game machine of FIG. 2.

Referring to FIG. 3, there is shown a schematic block diagram depicting a conventional way of connecting the I/O interface 30 and the key matrix 40. The 10 keys (ON/OFF through SOUND) on the game machine are associated with the 10 keyswitches 42 which are connected in a one-to-one manner to the 10 I/O ports P1–P10 on the I/O interface 30. The controller 10 includes an LCD driver 12, a ROM 14, a RAM 16, a PSG, a CPU 20, and an I/O interface 30. I/O ports P1–P10 normally are pulled high. When a key is pressed, the I/O ports are forced to be connected to GND. This allows the CPU 20 to read the status of the I/O ports, thereby allowing the apparatus to know which key is being pressed down.

Accordingly, as a general rule, the I/O interface is required to provide a number of I/O ports exactly equal to the number of keys provided on the keypad. The number of pins on the IC chip of the I/O interface 30 is therefore proportional to the number of keys. Accordingly, to reduce the size of the IC package, there exists a need for a method capable of using fewer I/O ports to connect the same number of keys.

Figure 4A:
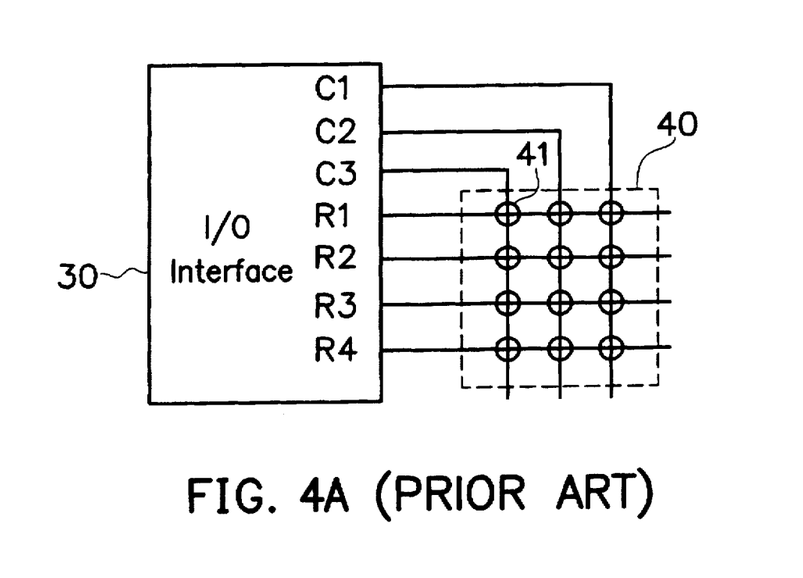
FIG. 4A is a schematic block diagram showing another conventional connection between a keypad and an I/O interface in the game machine of FIG. 2.
Figure 4B:
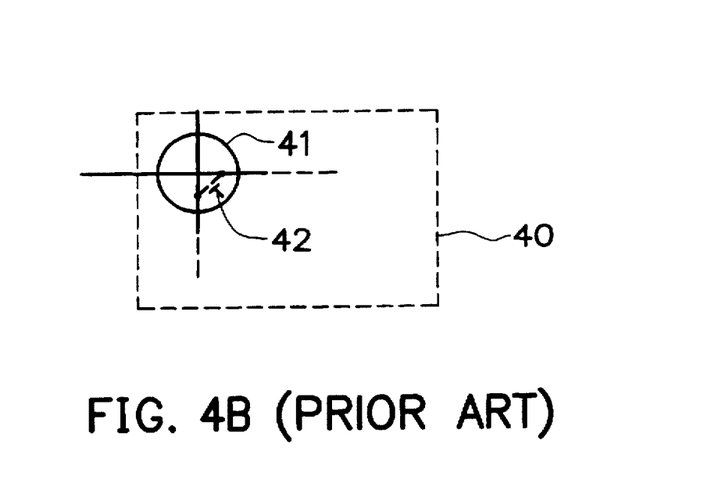
FIG. 4B is a schematic diagram showing a keyswitch associated with a key on the keypad shown in FIG. 4A.

A prior art solution to the foregoing problem is illustrated in FIGS. 4A–4B. As shown in FIG. 4A, the key matrix 40 is here modified into a 4×3 matrix with the columns respectively connected to the I/O ports C1, C2, C3 on the I/O interface 30 and the rows respectively connected to the I/O ports R1, R2, R3, R4 on the same interface 30. In total, there are formed 12 cross-points by the four rows and three columns, allowing a maximum of 12 keyswitches to be provided on the matrix, while a reduced number of 3+4=7 I/O ports are required on the I/O interface 30. Basically, a reduced number of pins on the IC substantially reduces the chip area of the IC and thus the manufacturing cost. Compared to the key matrix shown in FIG. 3, since the number of pins on the IC chip of the I/O interface 30 can now be reduced, the manufacturing cost for the IC chip can also be reduced. Furthermore, more keys can be provided on the key matrix to provide more functions to the game machine.

However, there still exists a need to further reduce the number of the I/O ports on the I/O interface, so that the IC chip of the I/O interface can be made even smaller in order to further reduce the manufacturing cost. This would allow the product to be more competitive in the market.

SUMMARY OF THE INVENTION

It is therefore an object of the invention to provide an apparatus for scanning a triangular or trapezoidal key matrix used for data input by pressing keys on a keypad. In particular, the employment of a triangular or trapezoidal key matrix allows an increased number of keys to be provided on the keypad while permitting a reduction in the number of I/O ports on the I/O interface.

It is another object of the invention to provide a method in conjunction with the foregoing apparatus for scanning the key matrix.

In accordance with the foregoing and other objects of the invention, there is provided a new and improved apparatus and method for scanning a triangular or trapezoidal key matrix for data input by depressing the keys of a keypad.

According to a first aspect of the apparatus of the invention, a triangular key matrix is constructed with m code lines and at least one power line. The I/O ports on the I/O interface are connected to the code lines. Each code line is not limited to being used as a row or column element in the key matrix.

According to a second aspect of the apparatus of the invention, a triangular key matrix is constructed with m code lines and at least one ground line. The I/O ports on the I/O interface are connected to the code lines and each code line is not limited to being used as a row or column element in the key matrix.

According to a third aspect of the apparatus of the invention, a trapezoidal key matrix is constructed with m code lines and at least one power line and one ground line. The I/O ports on the I/O interface are connected to the code lines and each code line is not limited to being used as a row or column element in the key matrix.

According to a first aspect of the method of the invention, the apparatus determines whether a key mounted on the power line is being depressed by setting all the I/O ports on the I/O interface as input ports and then detecting changes in the voltage level of the I/O ports. Also, the apparatus successively assigns, one at a time, each of the I/O ports as an output port, while the rest of the I/O ports are assigned as the input ports, and then detects the voltage change at the I/O port that is being currently assigned as the output port, to determine successively whether each key mounted at the cross-point of two corresponding code lines is being depressed.

According to a second aspect of the method of the invention, the apparatus determines whether a key mounted on the ground line is being depressed by setting all the I/O ports on the I/O interface as input ports and then detecting changes in the voltage level of the I/O ports. Also, the apparatus successively assigns, one at a time, each of the I/O ports as an output port and the rest of the I/O ports as input ports, and detects the voltage change at the I/O port that is being currently assigned as the output port, to determine successively whether a key mounted at the cross-point of two corresponding code lines is being depressed.

According to a third aspect of the method of the invention, the apparatus determines in a predetermined sequence whether each key mounted on the ground line and the power line is being depressed by setting all the I/O ports on the I/O interface as input ports and then detecting changes in the voltage level of the I/O ports. Also, the apparatus assigns successively, one at a time, each of the I/O ports as an output port and the rest of the I/O ports as input ports, and detects the voltage change at the I/O port that is being currently assigned as the output port to determine successively whether each key mounted at the cross-point of two code lines is being depressed.

The apparatus according to one aspect of the invention includes an I/O interface connecting the keypad to the apparatus. The I/O interface is provided with a number m of I/O ports (m an integer) whose voltage levels are set and subsequently detected by the apparatus to determine which key on the keypad is being depressed. A triangular key matrix, including a set of m code lines and at least one auxiliary code line, is arranged in such a way as to form a triangular array of m×(m+1)/2 cross-points, each cross-point being provided with a keyswitch associated with a key on the keypad. The m code lines are connected correspondingly to the m I/O ports on the I/O interface. The apparatus determines which key on the keypad is being depressed by setting all the I/O ports on the I/O interface as input ports and then detecting changes in the voltage level of the I/O ports. Also, the apparatus successively assigns one at a time each of the I/O ports as output port and the rest I/O ports as input ports, and detects the voltage change at the I/O port that is being currently set to as the output port to determine successively whether a key mounted at a cross-point of two code lines is being depressed.

In another embodiment, a trapezoidal key matrix is constructed with m code lines and two auxiliary code lines including a ground line and a power line, arranged in such a way as to form an m-by-(m+1) trapezoidal array of m×(m+3)/2 cross-points. The method according to the invention is performed by the apparatus to determine which key is being depressed and carry out various actions according to the function of the key being depressed.

The method according to one aspect of the invention includes the following steps:

(1) in a standby mode, pulling the I/O ports on the I/O interface to a first logic level;

(2) detecting whether any key associated with a keyswitch mounted on the auxiliary code line is being depressed;

(3) if a depressed key is not detected in step (2), then returning to step (1);

(4) if a depressed key is detected in step (2), then switching to a scan mode;

(5) in the scan mode, detecting whether the key detected to be depressed in step (2) is the ON/OFF key;

(6) if the ON/OFF key is not detected to be depressed in step (5), then returning to said step (1);

(7) if the ON/OFF key is detected to be depressed in step (5), then switching to an active mode;

(8) in the active mode, detecting whether any key associated with a keyswitch mounted on the auxiliary code line is being depressed;

(9) if a depressed key is detected in step (8), then detecting whether the depressed key is the ON/OFF key;

(10) if the ON/OFF key is detected to be depressed in step (9), then returning to step (1);

(11) if the ON/OFF key is not detected to be depressed in step (9), then performing an action designated by the depressed key;

(12) if no depressed key is detected in step (8), then successively and cyclically setting one of the I/O ports as an output port and setting the other I/O ports as input ports and detecting depression of any key associated with a keyswitch on the m code lines by detecting the voltage levels of the I/O ports; and (13) performing an action designated by the key detected to be depressed in step (12), and then returning to step (8).

BRIEF DESCRIPTION OF DRAWINGS

The invention can be more fully understood from the following detailed description of the preferred embodiments, with reference to the accompanying drawings, wherein.

DETAILED DESCRIPTION OF THE PREFERRED EMBODIMENTS

In accordance with the invention, the game machine of FIG. 1, which is provided with 10 keys, advantageously needs only 4 I/O ports on the I/O interface. In the following detailed description, preferred embodiments of the invention are directed to applications on the handheld LCD game machine of FIG. 1. However, it is to be understood that the details of these preferred embodiments such as the number of keys, the number of I/O ports, and the functions of the keys, are not intended to limit the scope of the invention.

Figure 5:
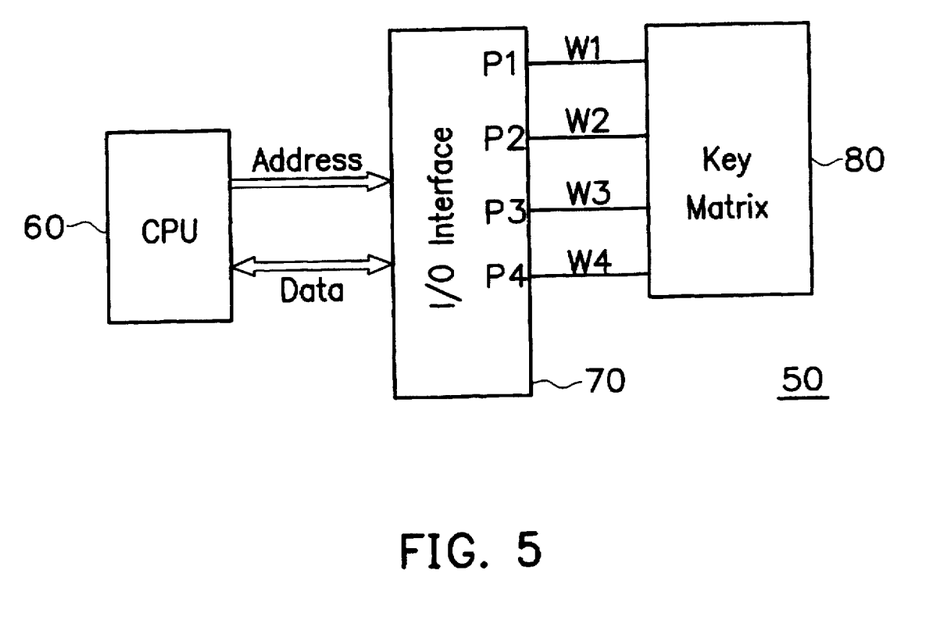
FIG. 5 is a schematic block diagram showing an apparatus according to the invention for scanning a key matrix.

Referring to FIG. 5, there is shown a schematic block diagram of an apparatus 50 according to the invention, which includes a CPU 60, an I/O interface 70, and a key matrix 80. In accordance with the invention, the I/O interface 70 needs only four I/O ports: P1, P2, P3, and P4 for receiving key codes from the 10 keys on the game machine. In this section, three embodiments of the key matrix 80 are disclosed, respectively shown in FIG. 6, FIG. 7, and FIG. 8. In these three figures, the keyswitches 42 provided at the cross-points 41 of columns and rows are identical in structure to that shown in FIG. 4B, so a detailed description thereof will not be repeated.

In the detection of any keystrokes on the key matrix 80, the CPU 60 sets specific strong drive or weak drive logic levels on the I/O ports P1, P2, P3, and P4 through the I/O interface 70 so as to scan the key matrix 80 via the code lines W1, W2, W3, and W4. According to one aspect of the invention, as respectively illustrated by the embodiments of FIG. 6, FIG. 7, and FIG. 8, the four code lines W1, W2, W3, and W4 are wired in the key matrix 80 together with a ground line V1 and/or a power line V2 in such a way as to form a triangular (FIG. 6 and FIG. 7) or trapezoidal (FIG. 8) array of cross-points 41, each being connected with a keyswitch 42 associated with a key 4 on the keypad 3 of the game machine. When the player depresses any key on the keypad, the associated keyswitch will make conductive the two code lines that form the cross-point on which the keyswitch is mounted. Since the associated code lines are connected in a wired-OR manner, the voltage levels of the associated I/O ports on the I/O interface 70 are changed. Accordingly, the CPU 60 is able to determine which key is being depressed by detecting the voltage levels of the four I/O ports P1, P2, P3, and P4.

It is to be noted that there are no limitations imposed by the invention to the connection of any of the I/O ports P1, P2, P3, and P4 to particular rows or columns in the key matrix. The connections can be determined arbitrarily. Fundamentally, the four code lines W1, W2, W3, and W4 connected respectively to the four I/O ports P1, P2, P3, and P4 are to be arranged together with a ground line V1 as in the embodiment of FIG. 6, or with a power line V2 as in the embodiment of FIG. 7, or with both as in the embodiment of FIG. 8, to form either a triangular or a trapezoidal matrix of cross-points for mounting the keyswitches. The three embodiments of the key matrix 80 will be described in more detail in the following.

Figure 6:
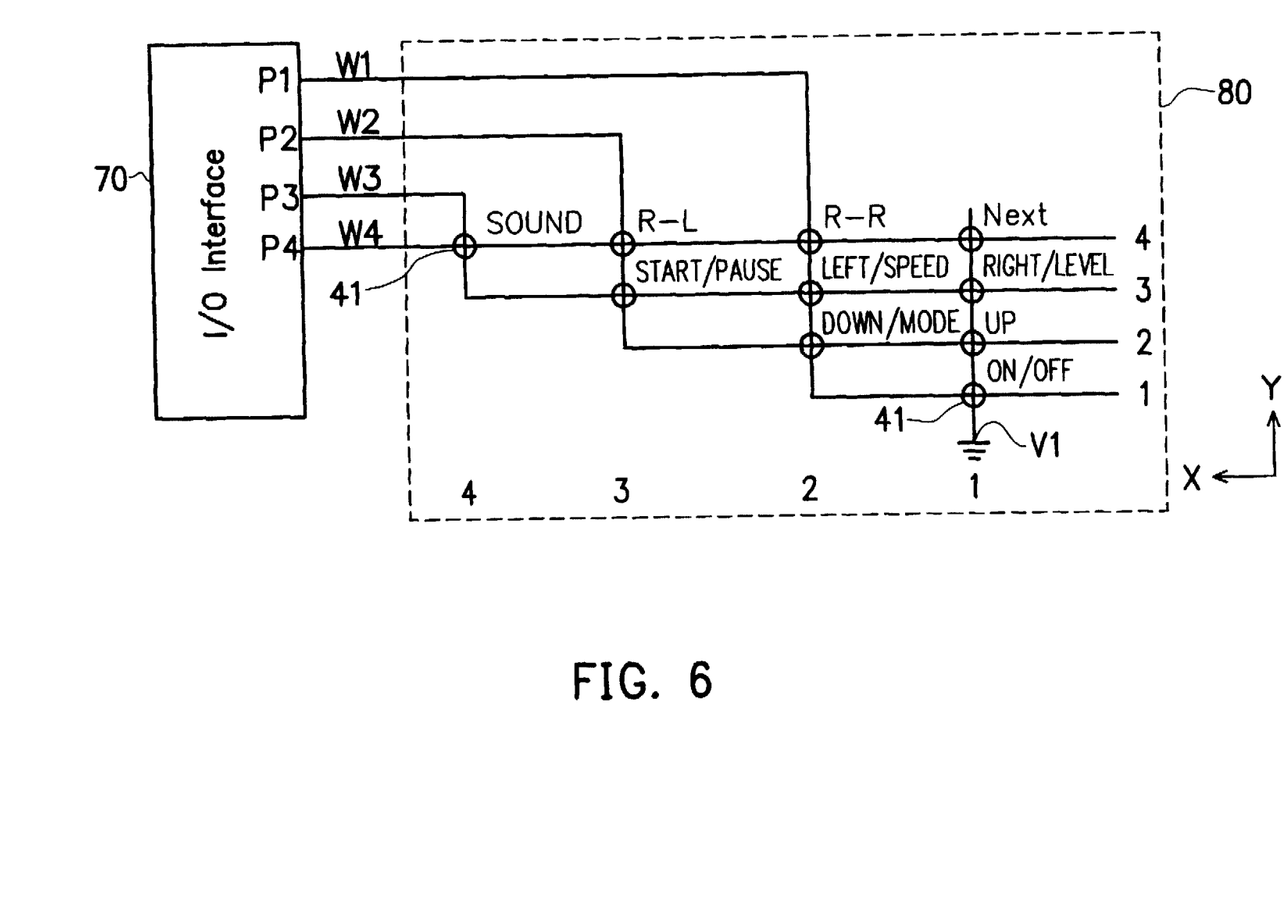
FIG. 6 is a schematic diagram showing a triangular matrix of keyswitches arranged according to the first preferred embodiment of the invention.

First Preferred Embodiment (FIG. 6)

Referring to FIG. 6, there is shown a schematic diagram depicting a triangular matrix of keyswitches arranged according to the first embodiment of the invention, which consists of 4 rows and 4 columns connected in such a way as to form a triangular matrix of 10 cross-points 41, each being mounted with a keyswitch 42. the triangular matrix, along the X-axis direction, the first column (the right-most column) is constructed with a ground line V1, the second column is constructed with the code line W1, the third column is constructed with the code line K and the fourth column is constructed with the code line W3. Along the Y-axis direction, the first row (the bottom-most row) is constructed with the code line W1 which intersects the ground line V1 at a cross-point 41 used to set the switch key, i.e., the ON/OFF key on the game machine (see FIG. 1). The second row is constructed with the code line W2 which intersects the code line W1 and the ground line V1 at two respective cross-points used to set the DOWN/MODE key and the UP key. The third row is constructed with the code line W3 which intersects the code line W2, the code line W1, and the ground line V1 at respective cross-points used to set the START/PAUSE key, the LEFT/SPEED key, and the RIGHT/LEVEL key. The fourth row is constructed with the code line W4 which intersects the code line W3, the code line K2, the code line W1, and the ground line V1 at respective cross-points used to set the SOUND key, the R-L key, the R-R key and the Next key.

From the foregoing it is apparent that in accordance with the invention only four I/O ports P1, P2, P3, and P4 on the I/O interface are needed for connection with four code lines W1, W2, W3, and W4 used to transmit the keystroke signals from a set of 10 keys. This is to be compared to the prior art arrangements shown in FIG. 3 and FIG. 4, which require as many as 10, and at least 7 I/O ports for receiving the keystroke signals from the same set of 10 keys.

Figure 7:
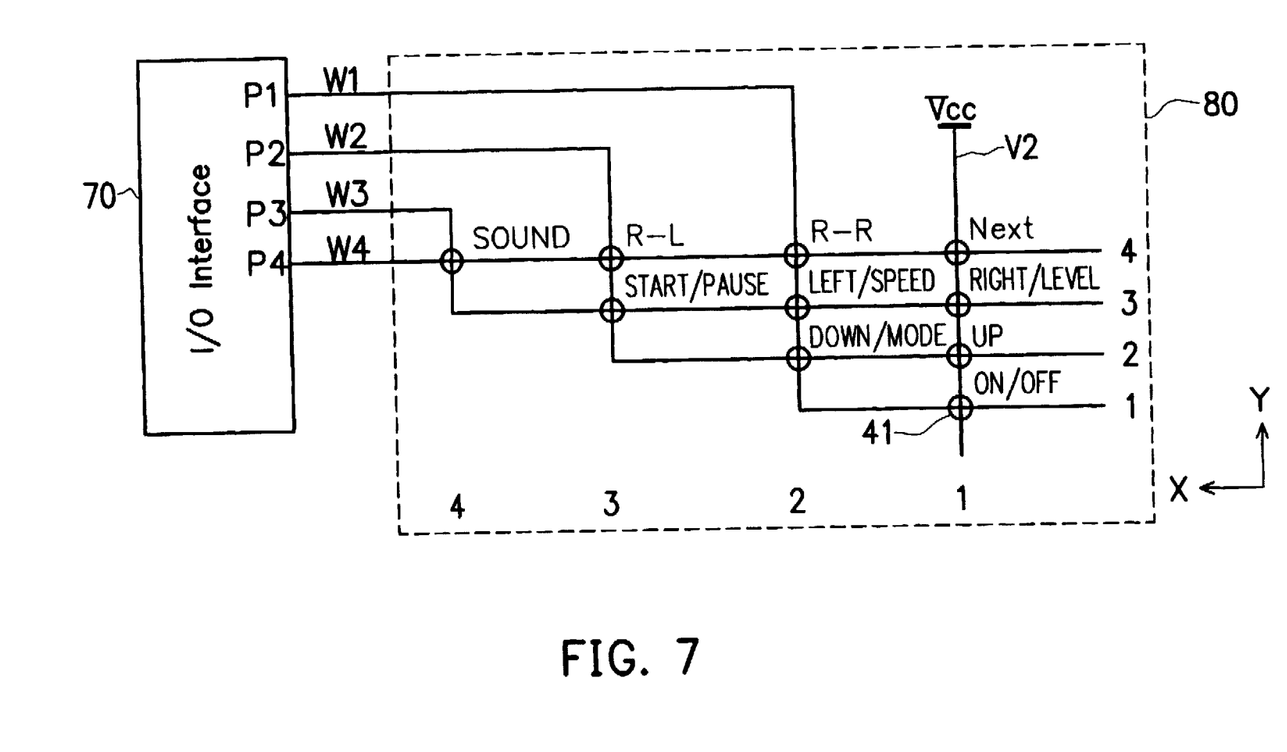
FIG. 7 is a schematic diagram showing a triangular matrix of keyswitches arranged according to the second preferred embodiment of the invention.

Second Preferred Embodiment (FIG. 7)

Referring to FIG. 7, there is shown a schematic diagram depicting a triangular matrix of keyswitches arranged according to the second preferred embodiment of the invention, which consists of 4 rows and 4 columns connected in such a way as to form a matrix of 10 cross-points 41, each being mounted with a keyswitch 42. It differs from the first preferred embodiment only in that the ground line V1 in the first preferred embodiment is here replaced with a Vcc power line V2 (Vcc=5 volts).

In the triangular matrix, along the X-axis direction, the first column (the right-most column) is constructed with the power line V2, the second column is constructed with the code line W1, the third column is constructed with the code line W2; and the fourth column is constructed with the code line W3. Along the Y-axis direction, the first row (the bottom-most row) is constructed with the code line W1 which intersects the power line V2 at a cross-point 41 used to set the ON/OFF key on the game machine (see FIG. 1). The second row is constructed with the code line which intersects the code line W1 and the power line V2 at respective cross-points used to set the DOWN/MODE key and the UP key. The third row is constructed with the code line W3 which intersects the code line W2, the code line W1, and the power line V2 at respective cross-points used to set the START/PAUSE key, the LEFT/SPEED key, and the RIGHT/LEVEL key. The fourth row is constructed with the code line W4 which intersects the code line W3, the code line W2, the code line W1, and the power line V2 at respective cross-points used to set the SOUND key, the R-L key, the R-R key and the Next key.

From the foregoing, it is apparent that only four I/O ports P1, P2, P3, and P4 on the I/O interface are needed for connection with four code lines W1, W2, W3, and W4 used to transfer the keystroke signals from a set of 10 keys. This is to be compared to the prior art arrangements shown in FIG. 3 and FIG. 4, which require as many as 10, and at least 7 I/O ports for receiving the keystroke signals from the same set of 10 keys.

Figure 8:
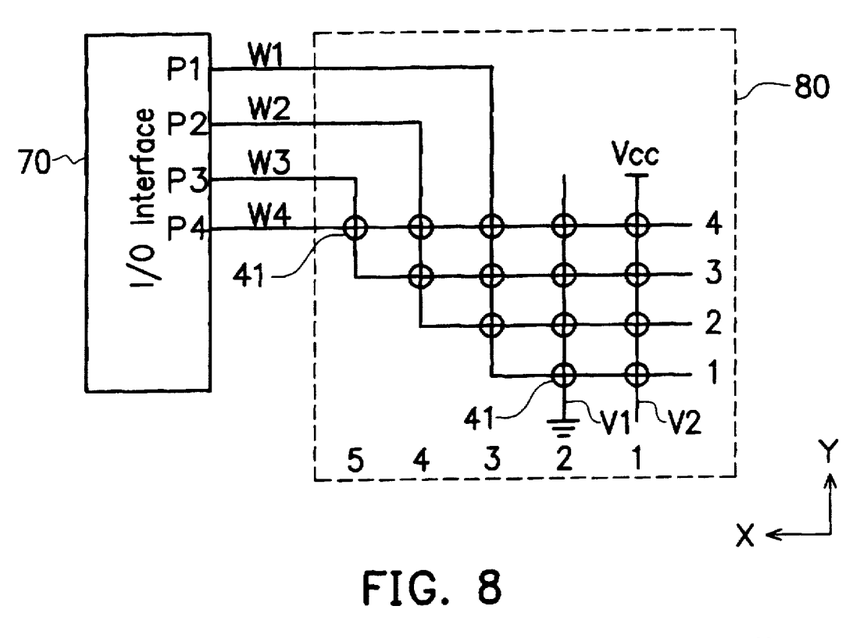
FIG. 8 is a schematic diagram showing a trapezoidal matrix of keyswitches arranged according to the third preferred embodiment of the invention.

Third Preferred Embodiment (FIG. 8)

Referring to FIG. 8, there is shown a schematic diagram depicting a trapezoidal matrix of keyswitches arranged according to the third preferred embodiment of the invention. In FIG. 8, identical elements to those shown in FIG. 6 and FIG. 7 are labeled with the same numerals. Also, the layout of the keyswitches on the key matrix 80 here in this embodiment is the same as that in the first and second preferred embodiments, so description thereof will not be repeated.

This embodiment differs from the previous two in that the trapezoidal matrix includes in addition to the code lines W1, W2, W3, and W4 both a ground line V1 and a power line V2 for constructing the trapezoidal matrix of cross-points. The ground line V1 represents a permanent logic-0 code line and the power line V2, which is coupled to a 5-volt source Vcc, represents a permanent logic-1 code line.

In the trapezoidal matrix, along the X-axis direction, the first column (the right-most column) is constructed with the power line 12 and the second column is constructed with the ground line V1. This arrangement can be reversed, i.e., with the first column constructed with the ground line V1 and the second column constructed with the power line V2. The rest of the columns are arranged in a way similar to the first and second embodiments. Along the Y-axis direction, the arrangement the code lines W1, W2, W3, and W4 in rows is similar to that in the key matrices of the first and second embodiments. Characteristically, the third embodiment forms a trapezoidal matrix of 14 cross-points 41.

From the forgoing, it is apparent that only four I/O ports P1, P2, P3, and P4 on the I/O interface are needed for setting 14 keys on the key matrix. By contrast, the prior art arrangements shown in FIG. 3 and FIG. 4 require as many as 10, and at least 7 I/O ports for setting a set of 10 keys.

Figure 9:
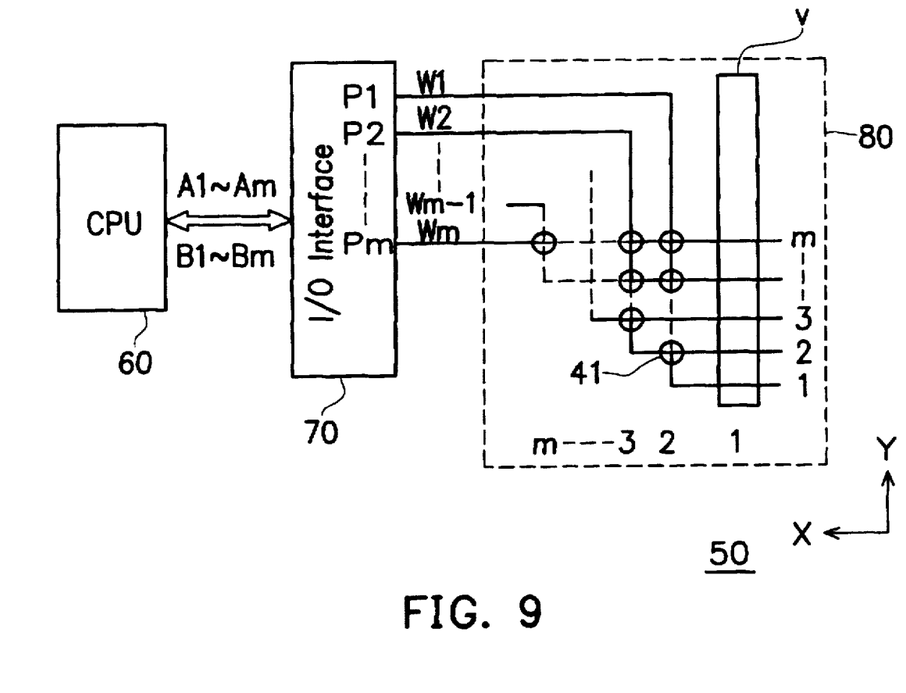
FIG. 9 is a schematic diagram of the apparatus according to the invention with the I/O interface provided with m I/O ports.

I/O interface with m I/O ports (FIG. 9)

The foregoing three embodiments of the invention are directed to the handheld LCD game machine of FIG. 1 to provide four I/O ports on the I/O interface 70. However, the invention is not limited as to the number of the I/O ports or the functions of the apparatus. Broadly speaking, the apparatus according to the invention is suitable for use to provide an arbitrary number m of I/O ports on the I/O interface 70 for receiving keystroke signals from a maximum of m×(m+1)/2 keys by employing a triangular key matrix and m×(m+3)/2 by employing a trapezoidal key matrix.

Referring to FIG. 9, there is shown a schematic diagram of the apparatus according to the invention by which a set of m×(m+1)/2 or m×(m+3)/2 keys can be provided on the key matrix 70 with just m I/O ports on the I/O interface 70. In FIG. 9, the keyswitches 42 provided at the cross-points 41 of the columns and rows are identical in structure to that shown in FIG. 4B, so that a detailed description thereof will not be repeated. The apparatus 50 shown in FIG. 9 comprises a CPU 60, an I/O interface 70 having m I/O ports P1–Pm, and a key matrix 80 including a corresponding number of code lines W1–Wm and an auxiliary code line set V. In the key matrix 80, the m code lines W1–Wm and the auxiliary code line set V are arranged in m rows and m columns in such a way as to form a triangular (or trapezoidal) array of m×(m+1)/2 (or m×(m+3)/2) cross-points 41, each of which is to be mounted with a keyswitch 42 associated with a key on the keypad. In detecting any keystrokes on the key matrix 80, the CPU 60 sets potentials on the I/O ports P1–Pm of the I/O interface 70, so as to scan the key matrix 80 via the code lines W1–Wm.

When a player depresses any key on the keypad, the associated keyswitch will make conductive the two code lines that form the cross-point on which the keyswitch is mounted, thereby changing the voltage level of the associated I/O ports of the I/O interface 70. Accordingly, the CPU 60 is able to determine through lines B1–Bm which key is being depressed by detecting the voltage levels of the I/O ports P1–Pm. If there are no changes to the voltage levels of the I/O ports P1–Pm, the CPU 60 will continue the scan for the presence of any keystrokes.

It is to be noted that there are no limitations imposed by the invention on the connection of the I/O ports P1–Pm to particular rows or columns in the triangular or trapezoidal array. The connections can be set arbitrarily, as will be described in the following.

In the key matrix 80, the code lines W1–Wm and the auxiliary code line set V are arranged into m rows 1 through m and m columns 1 through m. In the X-axis direction, the first column (the right-most column) is constructed with the auxiliary code line set V, the second column is constructed with the code line W1, the third column is constructed with the code line W, . . . , and the (m)th column is constructed with the code line Wm–1. In the Y-axis direction, the first row (the bottom-most row) is constructed with the code line W1 which intersects the auxiliary code line set V at one or more cross-points, the second row is constructed with the code line W2 which intersects the code line W1 and the auxiliary code line set V at respective cross-points, . . . , and the (m)th row is constructed with the code line Wm which intersects each of the code lines Wm–1, Wm–2, . . . , and W1 and the auxiliary code line set V at respective cross-points. Accordingly, there is formed a triangular matrix of m×(m+1)/2 cross-points or a trapezoidal matrix m×(m+3)/2 cross-points, depending on the number of lines in the auxiliary code line set V.

In preferred embodiments, the auxiliary code line set V includes one or two code lines. For example, the auxiliary code line set may include only one auxiliary code line, this being the ground line V1 used in the first embodiment shown in FIG. 6. In this case, the ground line V1 intersects each of the code lines W1–Wm such that m cross-points are formed to mount m keyswitches.

Alternatively, the auxiliary code line set V can be a power line V2 such as that used in the second embodiment shown in FIG. 7. In this case, the power line V2 intersects each of the code lines W1–Wm such that m cross-points are formed to mount m keyswitches.

As a further alternative, the auxiliary code line set V can include two code lines in the form of a ground line V1 and a power line V2 such as those used in the third embodiment shown in FIG. 8. In this case, the ground line V1 and the power line V2 each intersect the code lines W1–Wm once such that 2m cross-points are formed to mount 2m keyswitches. In other words, a total of m×(m+1)/2+m=m×(m+3)/2 cross-points are formed, such that the key matrix 80 can accommodate m×(m+3)/2 keyswitches with the I/O interface 70 provided with only m I/O ports.

On the keypad 3 shown in FIG. 1, the keys ON/OFF, DOWN/MODE, and START/PAUSE are basic function keys while the others are auxiliary keys that can be mounted according to requirements. It is an additional aspect of the invention that the keyswitches associated with keys on the keypad whose functions are mutually exclusive so that they will never be used concurrently (i.e., mutually exclusive keys so that they will never be depressed at the same time) are mounted on the same row. For instance, referring back to FIG. 6, those keys in the fourth row, including the SOUND, R-L, R-R, and Next keys, are mounted on the same row. Since these keys will never be used concurrently, the arrangement of them in the same row allows the user to avoid depressing any pair of these keys concurrently, for instance rotation and shift, which would cause the CPU 60 to be unable to detect the keystroke signals.

On the other hand, those keys that are intended to be depressed together at the same time to carry out a combined action (and therefore not mutually exclusive), should not be mounted in the same row. For instance, as shown in FIG. 6, for the rotation keys R-R and R-L and the shift keys UP, DOWN/MODE, LEFT/SPEED, and RIGHT/LEVEL, since the player might want to simultaneously rotate an object on the screen while shifting that object, any one of the rotation keys should not be mounted in the same row along with any one of the shift keys. If mounted in the same row, the simultaneous depression of two keys from respective groups would cause the CPU 60 to be unable to detect the keystroke signals.

Moreover, conventional handheld LCD game machines are customarily provided with a standby (or sleep) mode so as to allow the IC to enter into a power saving mode under an idled waiting status. In the power saving mode, the IC stops the clock oscillator (not shown) from generating clock signal. To leave the power saving mode, the user needs just to press the ON/OFF key, which activates the clock oscillator to generate the clock signal again, allowing the IC to return to the active mode.

In the standby (or sleep) mode, since the oscillator clock signal is idled, no key scan can be carried out. Therefore, a special key is required to return the IC to the active mode. When the special key is pressed, one of the I/O ports P1–P4 is changed from a weak drive logic-1 high voltage to a strong drive logic-0 low voltage, which causes the generation of an interrupt signal that activates the clock oscillator to generate the clock signal. Meanwhile, the CPU 60 starts to execute an interrupt service routine for a keyboard scan.

Accordingly, in applications that include a standby mode, the ON/OFF key should be provided in the following manner: select either the ground line V1 or the power line V2 as the row in which the ON/OFF key is to be arranged, and select one of the I/O ports P1–P4, for instance port P1, as a line for generating the interrupt signal. The code line that is connected to the selected I/O port, for example codeline W1 if port P1 is selected, is used as the column in which the ON/OFF key is arranged. This arrangement allows the apparatus 50 to enter into the active mode when the ON/OFF key is depressed. Details about the active and other modes will be described in the following description of a preferred method of scanning the key matrix.

Method for Scanning the Key Matrix

The method performed by the apparatus 50 according to the invention for scanning the key matrix 80, is described below, with reference to FIG. 6 and FIG. 10.

Figure 10:
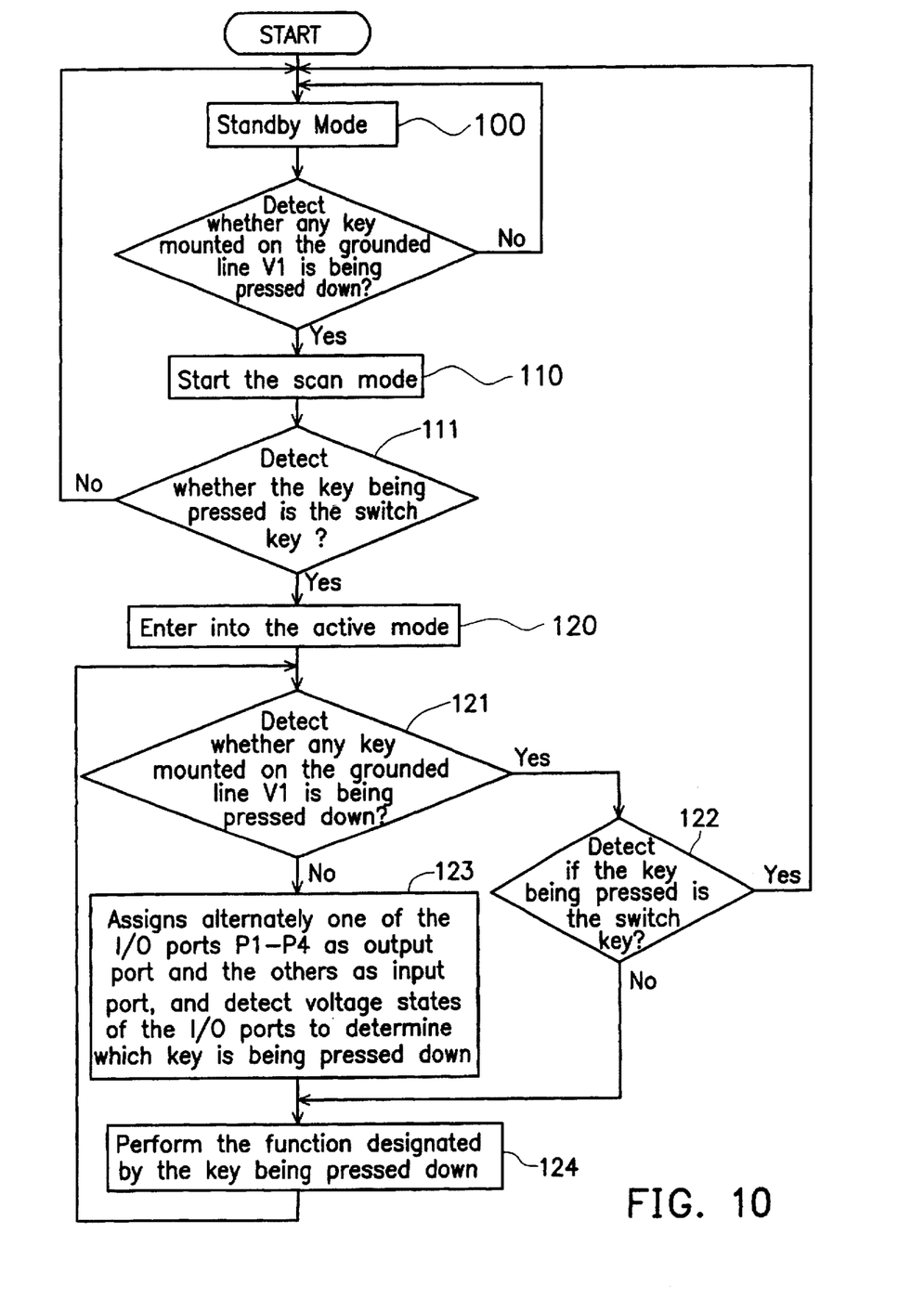
FIG. 10 is a flow diagram of the actions carried out by the apparatus of FIG. 5 in procedural steps for scanning a key matrix.

Referring to FIG. 10, in the initial step 100, the key matrix scanning apparatus 50 is switched to the standby mode for the purpose of saving electric power. Meanwhile, the CPU 60 pulls the four I/O ports P1–P4 on the I/O interface 70 to a specific logic level as a pull-high weak drive logic-1 voltage level.

In the second step 101, the CPU 60 detects whether any keyswitch on the ground line V1 is being depressed (pressed down). If NO, the procedure returns to the initial step 100; and if YES, the procedure goes to step I/O in which the scan mode is started. The ground line V1 is in a strong drive logic-0 voltage level. Thus, when a key on the ground line V1 is depressed so that the associated keyswitch conducts, the I/O port that is associated with the key and has a weak drive logic-1 voltage level is changed to a strong drive logic-0 voltage level, since the associated code lines are connected in a wired-OR manner. The presence of a strong drive logic-0 voltage level at any I/O port causes the scan mode to be started, which is the action carried out in step I/O.

In the subsequent step 111, the CPU 60 detects whether the key being depressed is the ON/OFF key. If NO, the procedure returns to the initial step 100, since the power switch must be depressed before other functions can be carried out; otherwise the procedure proceeds to the next step 120 in which the CPU 60 sets the apparatus to the active mode. In the active mode, the CPU 60 sets the I/O port to scan the key matrix. The ON/OFF interrupt mode is valid when the apparatus is in the standby mode after having been switched to the active mode in which ON/OFF interrupt was disabled, and the apparatus is switched to the scan mode by the CPU.

In the active mode, the apparatus carries out several actions. First in step 121, the CPU 60 detects whether any key mounted on the ground line V1 is being depressed. If YES, the procedure goes to step 122, in which the CPU 60 checks whether the depressed key is the ON/OFF key. If YES, the procedure returns to the initial step 100; otherwise, the procedure proceeds to step 124, in which the CPU 60 carries out the function designated by the depressed key. In the foregoing step 121, if the result is that one key is depressed, the procedure goes to step 123 in which the I/O ports P1, P2, P3, and P4 are set at weak drive logic-1 voltage level and, meanwhile, the CPU 60 detects the status of these I/O ports. If any key on the ground line V1 is being pressed to close the associated keyswitch, the associated I/O port will be changed to a strong drive logic-0 voltage level. This allows the CPU 60 to determine which key is being depressed.

In step 123, the CPU 60 successively and cyclically assigns each of the I/O ports P1, P2, P3, and P4 as an output port while assigning the rest of the I/O ports as input ports, and detects any voltage change at the I/O port that is currently set as the output port, so as to determine which key is being depressed. Among the I/O ports, the one that is used for the output signal is set at the strong drive logic-0 voltage level while the one that is used for the input signal is set at the weak drive logic-1 voltage level. When any key is being depressed, the wire-or connection allows a change in the voltage state of the I/O ports that causes the CPU 60 to determine which key is being depressed.

In the subsequent step 124, the CPU 60 carries out the function designated by the key being depressed. After that, the procedure returns to the step 121. If the active mode lasts for a predetermined period of time without detecting any keystrokes, the procedure returns to the initial step 100 of the standby mode.

Circuit Structure of the I/O Interface

To further detail the method according to the invention for scanning the key matrix, the circuit structure of the I/O interface is now described in the following, with reference to FIG. 6 and FIG. 11.

Figure 11:
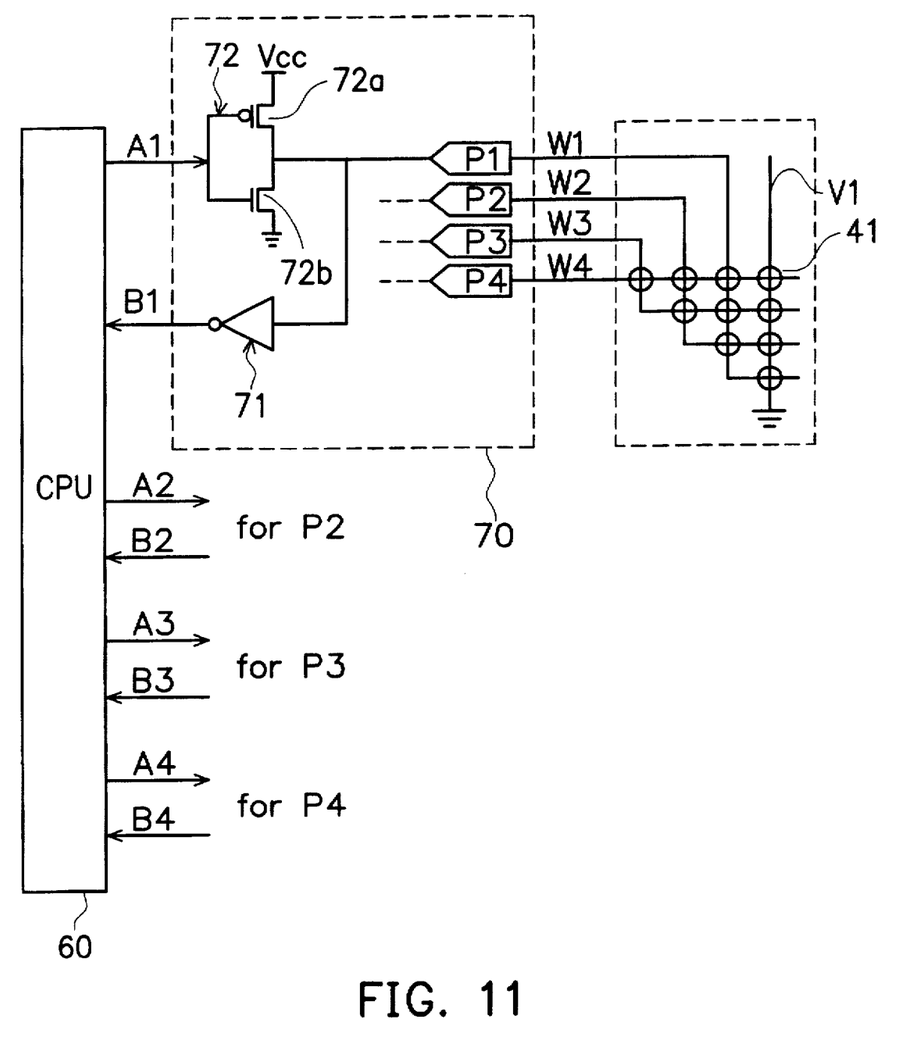
FIG. 11 shows a detailed block diagram of the I/O interface employed in the apparatus according to the invention.

Referring to FIG. 11, for each I/O port Pi, i=1,...m, of the I/O interface 70, a corresponding inverter 72 and another corresponding inverter 71 connect the I/O port Pi to the CPU via lines Ai and Bi. In this figure only four ports Pi, I=1,...4 are shown. The inverter 72 includes a PMOS transistor 72a and an NMOS transistor 72b, wherein the PMOS transistor 72a is a long-channel type of PMOS transistor and thus the output of the inverter 72 is a weak drive high logic-1 signal, whereas the NMOS transistor 72b is a normal type of NMOS transistor for the output stage, and thus the output of the inverter is a strong drive low logic 0. If the signal on the line A1 from the CPU 60 is logic 0, this will thus cause the level at port P1 to become momentarily HIGH when the ON/OFF key is pressed and then to change to LOW since the ground is a strong drive low. This causes the falling edge HIGH to LOW of the port P1 to trigger an interrupt via line B1.

On the other hand, during the time that the CPU 60 performs a read operation, if any key mounted on the code line connected to the port P1 is being depressed, then one of the I/O ports P2–P4 that are used as input ports, for example port P2, will be turned from the weak drive logic-1 voltage level to the strong drive logic-0 voltage level. This voltage level is in turn subsequently inverted by the inverter 71 into a logic-1 voltage used to signify to the CPU 60, via the corresponding line B2, which key is being depressed. This is because a wire-or operation is performed on the strong drive logic-0 voltage level and the weak drive logic-1 voltage level, thus the input ports P2 will be turned to the strong drive logic-0 voltage level.

Taking the DOWN/MODE key as an example, its depression in the active mode will initiate several actions in sequence. First, as shown in FIG. 6, the CPU 60 sets the I/O ports P1, P2, P3, and P4 at the weak drive logic-1 voltage level, i.e., (P1, P2, P3, P4)=(1, 1, 1, 1), and then scans the ground line V1 (which is at the strong voltage logic-0 level) on which the key set (Next, RIGHT/LEVEL, UP, ON/OFF) is mounted, via the code lines W1, W2, W3, and W4. Since no key on the ground line V1 is being depressed, the voltage level of the I/O ports (P1, P2, P3, P4) remain unchanged, which signifies to the CPU 60 that no key on the currently scanned line is depressed.

Next, the CPU 60 sets the level at port P1 equal to 0 and the levels at ports (P2, P3, P4)=(1, 1, 1), i.e., the I/O port P1 at the strong drive logic-0 voltage level and the I/O ports P2, P3, P4 at the weak drive logic-1 voltage- level, and then scans the code line W1 on which the DOWN/MODE key is mounted. Since the depression of the DOWN/MODE key causes the port 2 to shift to the strong drive logic-0 voltage level, i.e., (P2, P3, P4)=(0, 1, 1), the CPU 60 is able to determine that the key mounted at the cross-point of the code line W1 and the code line W2 is depressed.

In other words, the CPU 60 sets the voltage level of the I/O ports (P1, P2, P3, P4) cyclically in the following sequence: (1,1,1,1)→(0,1,1,1)→(1,0,1,1)→(1,1,0,1)→(1,1,1,0), to scan the key matrix 80 as to which key is depressed.

By contrast, in the case of power line V2 shown in FIG. 7, the CPU 60 sets the voltage level of the I/O ports (P1, P2, P3, P4) cyclically in the following sequence: (0,0,0,0)→(0,1,0,0)→(0,0,1,0)→(0,0,0,1), to scan the key matrix 80 as to which key is being depressed. The operation here is the same in principle as the foregoing example except that here the PMOS 72a on the CMOS inverter 71 is used for strong drive and the NMOS 72b on a CMOS inverter 72 is used for weak drive.

Moreover, in the case of using a ground line V1 together with a power line V2 as shown in FIG. 8, the CPU 60 can set the I/O ports (P1, P2, P3, P4) in an interleaved way, i.e., first at (1,1,1,1) and then at (0,0,0,0), and so forth.

The invention has been described above with reference to exemplary embodiments. However, it is to be understood that the scope of the invention is not limited to the disclosed embodiments. For example, in another embodiment the CPU 60 can be eliminated and hardware circuits are used for the keyboard scan; or in applications where the standby mode is not used, the keypad is always in an active mode and there is no need to have the ON/OFF key. Therefore, the invention encompasses various modifications and similar arrangements, and the scope of the claims should be accorded the broadest interpretation so as to encompass all such modifications and similar arrangements.

What is claimed is:

1. A method of using an apparatus to scan a keypad having a plurality of keys provided on a data processing unit having a CPU, the plurality of keys including a switch key, the apparatus including an I/O interface for connecting the keypad to the CPU, the I/O interface being provided with a plural number m of I/O ports whose voltage levels are set and subsequently detected by the CPU to determine which key on the keypad is being depressed, the apparatus further including a key matrix including a set of m code lines and an auxiliary code line crossing in such a way as to form a triangular array of m×(m+1)/2 cross-points, each cross-point having mounted thereto a keyswitch associated with a particular key on the keypad, the keyswitches including one keyswitch associated with the switch key and mounted on the auxiliary code line, and the m code lines being connected in a one-to-one manner to the m I/O ports of the I/O interface, the method comprising the steps of:

(1) successively and cyclically setting one of the I/O ports as an output port and setting the other I/O ports as input ports and detecting depression of any key associated with a keyswitch on the m code lines by detecting the voltage levels of the I/O ports, and (2) performing an action designated by the key detected to be depressed in said step (1).

2. The method as claimed in claim 1, wherein the auxiliary code line is a ground line and the first logic level is a weak drive logic-1 voltage level.

3. A method of using an apparatus to scan a keypad having a plurality of keys provided on a data processing unit, the plurality of keys including a switch key, the apparatus including an I/O interface for connecting the keypad, the I/O interface being provided with a plural number m greater than two of I/O ports whose voltage levels are set and subsequently detected to determine which key on the keypad is being depressed, the apparatus further including a trapezoidal key matrix including a set of m code lines and at least a first auxiliary code line and a second auxiliary code line, crossing in such a way as to form an m-by-(m+1) trapezoidal array of m×(m+3)/2 cross-points, each cross-point having mounted thereto a keyswitch associated with a particular key on the keypad, the keyswitches including one keyswitch associated with the switch key, and mounted on the first auxiliary code line, and the m code lines being connected in a one-to-one manner to the m I/O ports of the I/O interface, the method comprising the steps of:

(1) successively and cyclically setting one of the I/O ports as an output port and setting the other I/O ports as input ports and detecting depression of any key associated with a keyswitch on the m code lines by detecting the voltage levels of the I/O ports; and (2) performing an action designated by the key detected to be depressed in said step (1).

4. The method as claimed in claim 3 wherein the first auxiliary code line is a power line serving as a permanent logic-1 code line and the second auxiliary code line is a ground line serving as a permanent logic-0 code line.

5. The method as claimed in claim 3 wherein the first auxiliary code line is a ground line serving as a permanent logic-0 code line and the second auxiliary code line is a power line serving as a permanent logic-1 code line.

* * * * *